United States Patent
Antich et al.

(10) Patent No.: US 6,353,238 B2
(45) Date of Patent: Mar. 5, 2002

(54) METHOD OF USING A WIDE WAVELENGTH RANGE HIGH EFFICIENCY AVALANCHE LIGHT DETECTOR WITH NEGATIVE FEEDBACK

(75) Inventors: Peter P. Antich, Richardson; Edward N. Tsyganov, Duncanville, both of TX (US)

(73) Assignee: Board of Regents, The University of Texas System, Austin, TX (US)

(*) Notice: Subject to any disclaimer, the term of this patent is extended or adjusted under 35 U.S.C. 154(b) by 0 days.

(21) Appl. No.: 09/840,771

(22) Filed: Apr. 23, 2001

Related U.S. Application Data

(62) Division of application No. 09/201,541, filed on Nov. 30, 1998, now Pat. No. 6,222,209, which is a continuation of application No. 08/771,207, filed on Dec. 20, 1996, now Pat. No. 5,844,291.

(51) Int. Cl.$^7$ ............................................. H01L 31/0352
(52) U.S. Cl. .................. 257/186; 257/438; 257/439; 257/461
(58) Field of Search ................................ 257/183–186, 257/199, 53, 431, 438, 439, 461, 464, 465

(56) References Cited

U.S. PATENT DOCUMENTS

| | | | |
|---|---|---|---|
| 3,622,784 A | 11/1971 | Del Guercio | 250/71.5 |
| 3,894,280 A | 7/1975 | Bishop et al. | 321/18 |
| 3,935,382 A | 1/1976 | Hunt | 178/7.1 |
| 4,007,104 A | 2/1977 | Summers et al. | 204/192 |
| 4,194,888 A | 3/1980 | Schwab et al. | 55/2 |
| 4,311,908 A | 1/1982 | Goulianos et al. | 250/374 |
| 4,464,630 A | 8/1984 | Eddins | 330/107 |
| 4,486,765 A | 12/1984 | Capasso | 357/13 |
| 4,535,233 A | 8/1985 | Abraham | 250/214 |

(List continued on next page.)

FOREIGN PATENT DOCUMENTS

SU      1702831      10/1989

OTHER PUBLICATIONS

Afanasiev et al., "MRS Silicon Avalanche Detectors with Negative Feedback for Time–of–Flight Systems," Proceedings of the 4th International Conference on Advanced Technology and Particle Physics, Como, Italy, Oct. 3–7, 1994, published in Nuclear Physics B (Proc. Suppl.) 44, pp. 402–405 (1995).

Antich et al., "Avalanche Photo Diode with Local Negative Feedback Sensitive to UV, Blue and Green Light," Nuclear Instruments & Methods in Physics Research, Section A 389, pp. 491–498 (1997).

Bisello et al., "Metal–Resistive Layer–Silicon (MRS) Avalanche Detectors with Negative Feedback," Proceedings of Wire Chamber Conference, Feb. 1995, published in Nuclear Instruments and Methods in Physics Research A 360, pp. 83–86 (1995).

(List continued on next page.)

*Primary Examiner*—Eddie Lee
*Assistant Examiner*—Bradley W. Baumeister
(74) *Attorney, Agent, or Firm*—Fulbright & Jaworski, LLP

(57) ABSTRACT

A novel use of a solid state light detector with a low impedance substrate is described. Light that enters the substrate after traversing the antireflective layer creates an electron-hole pair. The electrons are collected in a crystalline epitaxial layer that spans the space charge region, or depletion layer. A high electric field accelerates free electrons inside the depletion region. The electrons collide with the lattice to free more holes and electrons resulting from the presence of a n-p junction, or diode. The diode is formed by placing the crystalline layer which has positive doping in close proximity with the electrodes which have negative doping. The continual generation of charge carriers results in avalanche multiplication with a large multiplication coefficient. During the avalanche process, electrons can be collected enabling light detection. A resistive layer is used to quench, or stop, the avalanche process.

10 Claims, 2 Drawing Sheets

U.S. PATENT DOCUMENTS

| | | | |
|---|---|---|---|
| 4,730,128 A | 3/1988 | Seki | 307/310 |
| 4,794,257 A | 12/1988 | Baba et al. | 250/370.01 |
| 4,885,620 A | 12/1989 | Kemmer et al. | 357/24 |
| 4,896,200 A | 1/1990 | Seki et al. | 357/30 |
| 4,956,716 A | 9/1990 | Hewitt et al. | 358/213.27 |
| 4,973,913 A | 11/1990 | Oda | 328/117 |
| 5,026,148 A | 6/1991 | Wen et al. | 350/386 |
| 5,138,476 A | 8/1992 | Shibutani | 359/191 |
| 5,144,122 A | 9/1992 | Danley et al. | 250/201.2 |
| 5,162,658 A | 11/1992 | Turner et al. | 250/554 |
| 5,164,809 A | 11/1992 | Street et al. | 257/55 |
| 5,198,673 A | 3/1993 | Rougeout et al. | 250/370.11 |
| 5,245,191 A | 9/1993 | Barber et al. | 250/363.04 |
| 5,281,821 A | 1/1994 | Antich et al. | 250/368 |
| 5,334,839 A | 8/1994 | Anderson et al. | 250/368 |

OTHER PUBLICATIONS

Bisello et al., "Electrical Characteristics of Metal–Resistive Layer–Silicon (MRS) Avalanche Detectors," Proceedings of the 4th International Conference on Advanced Technology and Particle Physics, Como, Italy, Oct. 3–7, 1994, published in Nuclear Physics B (Proc. Suppl.) 44, pp. 397–401 (1995).

Bisello et al., "Silicon Avalanche Detectors with Negative Feedback as Detectors for High Energy Physics," Proceedings of Wire Chamber Conference, Feb., 1995, published in Nuclear Instruments and Methods in Physics Research A 367, pp. 212–214 (1995).

Kulkarni et al., "New Approaches in Medical Imaging Using Plastic Scintillating Detector," Nuclear Instruments and Methods in Physics Research B79, pp. 921–925 (1993).

Locker et al., "A New Ionizing Radiation Detection Concept Which Employs Semiconductor Avalanche Amplification and the Tunnel Diode Element," Applied Physics Letters, vol. 9, No. 6, pp. 227–230 (1996).

Sadygov et al., "The Investigation of Possibility to Create the Multichannel Photodetector Based on the Avalanche MRS–Structure," Proceedings of the SPIE—The International Society for Optical Engineering, Zvenigorod, USSR, Apr. 2–6, 1991, published in SPIE vol. 1621, Optical Memory and Neural Networks, pp. 158–168 (1991).

Shushakov et al., "New Solid State Photomultiplier," Report at Optoelectronic Integrated Circuit Materials, PHysics and Devices Conference (part of Photonics West 95 Symposium, Feb. 11, 1995, SPIE vol. 2397, pp. 544–554 (1995).

METHOD OF USING A WIDE WAVELENGTH RANGE HIGH EFFICIENCY AVALANCHE LIGHT DETECTOR WITH NEGATIVE FEEDBACK

This is a divisional of applicatin Ser. No. 09/201,541, filed Nov. 30, 1998, issued as U.S. Pat. No. 6,222,209; which is a continuation of U.S. Ser. No. 08/771,207, filed Dec. 20, 1996, issued as U.S. Pat. No. 5,844,291.

1. FIELD OF THE INVENTION

The invention relates in general to the field of light detection using semiconductor devices, and more particularly, to the use of exceptionally designed avalanche diodes for light detection. Specifically, the invention relates to a novel design of conductor-resistor-semiconductor (CRS) avalanche detector with negative local feedback for photon detection and signal amplification.

2. BACKGROUND OF THE INVENTION

In semiconductor material, light with a wavelength between 300 nm and 1100 nm attenuates generating charge carriers (i.e., holes and electrons). In an intrinsic material, the small concentration of holes equals the concentration of electrons. In contrast, a doped material has a higher concentration of one charge carrier (e.g., more electrons than holes). A doped material that has more electrons is called n-type, while a doped material that has more holes is called p-type. Heavily doped materials, indicated by the addition of a plus sign after the n or p (e.g., $n^+$), have an overabundance of one carrier.

Semiconductor materials generally have a select number of bound electrons which result from charge attraction with the nucleus. However, semiconductors may also have unbound electrons that form a "sea" of electrons that can move around freely in the material. Some of the bound electrons may get excited and become free from their current location, or valence band, and to the conduction band. The energy difference between the valence band and the conduction band is defined as the band gap. The band gap between the valence and conductance bands for materials such as silicon is 1.1 eV which corresponds to a wavelength in the near infrared region of the electromagnetic spectrum (approximately 1120 nm).

Once charge carriers are created, they can be used to generate electrical signals. As would be apparent to one of ordinary skill, the movement of electrons generates a current which can be detected by various types of conventional detectors. Thus, light can be detected.

Often conventional avalanche devices may have a p-i-n structure. One of ordinary skill will recognize it as a semiconductor in which the positively doped layer (p) is separated from the negatively doped layer (n) by an intrinsic layer (i). The p-i-n structure can present such disadvantages as high working bias (hundreds of Volts), need for cooling systems, and difficulty in the production of large area and multi-channel elements with high gain, which strongly limits their use to a relatively small number of applications.

Other silicon avalanche detectors with negative feedback are based on CRS (ConductorResistor-Semiconductor) structure. Negative feedback, as known by those skilled in the art, is a method by which the process of avalanching can be limited at an appropriate point. FIG. 1 illustrates a conventional CRS avalanche detector with negative feedback. The conductive layer 100 is next to the SiC (resistive layer) 105. The resistive layer 105 is separated from the bulk semiconductor 110 by an $SiO_2$ (isolating layer) 115. The bulk semiconductor 110 in conventional CRS detectors generally has p-type doping with a lower $p^+$ layer 120 serving as a second conductive layer.

The CRS structure can supply a feasible alternative, free of many of the disadvantages 6f devices with p-i-n structures. CRS detectors can be operated at room temperature and relatively low voltages (approximately 40 to 50 V), with a multiplication coefficient as high as $10^4$–$10^5$, while providing good time resolution (less than 600 ps). They are routinely fabricated on the low-cost, low-resistivity silicon substrates, where both detector and preamplifying electronics can be easily integrated. Although initial results of conventional CRS detector tests are encouraging, especially since they have good spectral efficiency for the long wave range of light spectrum, there are some shortcomings in the CRS design that limit their abilities to detect light.

When the traditional CRS design is used, it is essentially only sensitive to the red portion of visible light. Another drawback is the requirement for the resistive layer to be transparent for the blue light, while having an electrical resistance high enough to quench avalanche multiplication. In addition, present CRS detectors have a diffusion zone behind the sensitive depleted region which can decrease time resolution and increase noise resulting from delayed charge carriers. Another disadvantage of CRS detectors is that a significant amount of the diode area is passive. The passivity which results from the circular geometry of the heavily doped n regions can hinder the enhancement of the electric field necessary for avalanche multiplication.

3. SUMMARY OF INVENTION

A semiconductor device in accordance with the invention is a novel design of a solid state light detector with a low impedance substrate. Light that enters the substrate after traversing the antireflective layer creates an electron-hole pair. The electrons are collected in a crystalline epitaxial layer that spans the space charge region, or depletion layer. A high electric field accelerates free electrons inside the depletion region. The electrons collide with the lattice to free more holes and electrons resulting from the presence of a n-p junction, or diode. The diode is formed by placing the crystalline layer which has positive doping in close proximity with the electrodes which have negative doping. The continual generation of charge carriers results in avalanche multiplication with a large multiplication coefficient. During the avalanche process, electrons can be collected enabling light detection. A resistive layer is used to quench, or stop, the avalanche process.

4. BRIEF DESCRIPTION OF DRAWINGS

5. DETAILED DESCRIPTION OF SPECIFIC EMBODIMENTS

Illustrative embodiments of the invention are described below as it might be employed in a novel design of a conductor-resistor-semiconductor (CRS) avalanche detector for photon detection and signal amplification. In the interest of conciseness, not all features of an actual implementation are described in this specification. It will of course be appreciated that in the development of any such actual embodiment numerous implementation-specific decisions must be made to achieve the developers' specific goals, such as compliance with system-related and business-related constraints, which will vary from one implementation to another. Moreover, it will be appreciated that though such a development effort might be complex and time-consuming, it would nevertheless be a routine undertaking for those of ordinary skill having the benefit of this disclosure.

5.1 Overview

When light quantum enters a substrate (e.g., silicon), it creates an electron-hole pair. The electrons are collected in a small (e.g., 2 μm) sensitive area spanning the space charge region, or depletion layer. A high electric field accelerates free electrons inside the depletion region of the semiconductor which collide with the lattice to free more holes and electrons. A continual generation of charge carriers results in avalanche multiplication with a large multiplication coefficient (e.g., $10^5$). During the avalanche process, the collection of the electrons and the corresponding redistribution of the electrical field in the space charge region takes place, thus lowering the potential drop across the depletion region. As a result, the electric field collapses and quenches the multiplication process providing a self-stabilized avalanche mechanism.

5.2 Illustrative Embodiment

Figure 1:
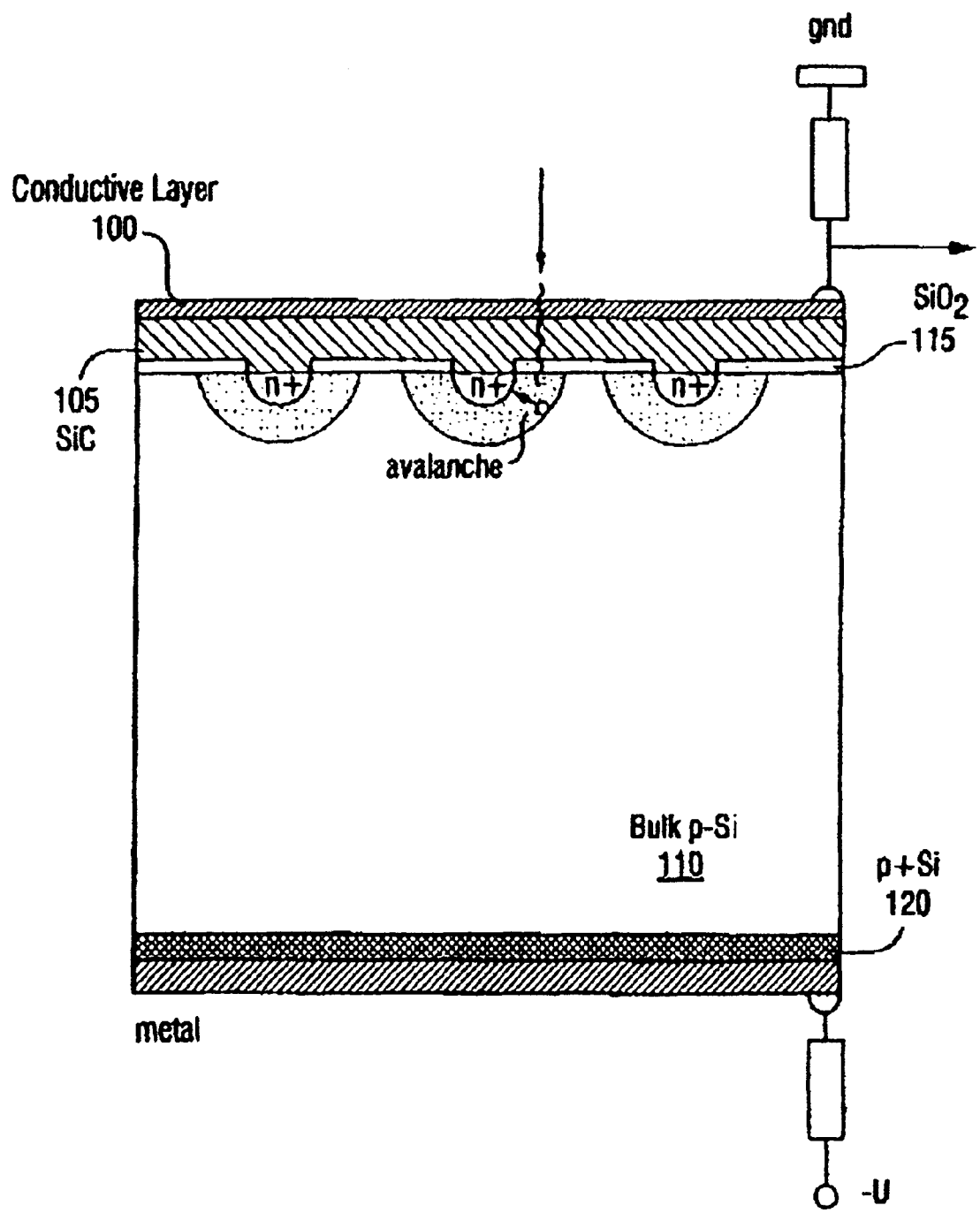
FIG. 1 illustrates a traditional avalanche CRS semiconductor detector device.
Figure 2:
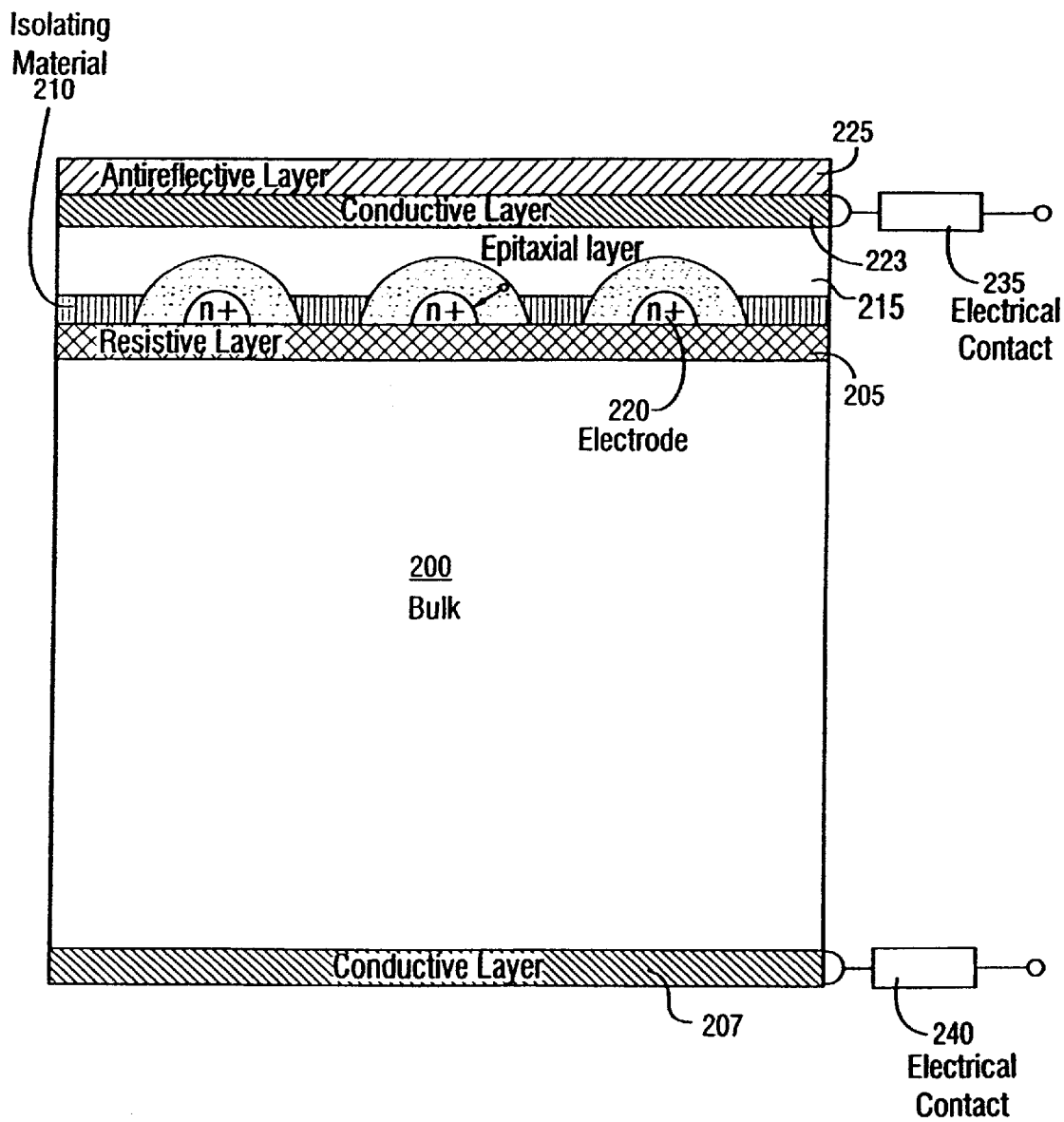
FIG. 2 is an illustrative embodiment of a CRS detector in accordance with the invention.

FIG. 2 shows an expanded view of each layer for one embodiment of a CRS detector in accordance with the invention. Conventional low cost, low impedance semiconductor bulk material, or substrate 200, may be used as a foundation upon which other layers can be built.

A resistive layer 205 composed of high band gap materials (such as, for example, silicon carbide) is placed on the substrate 200 using a deposition technique (e.g., plasma deposition). As will be apparent to those of ordinary skill in the art having the benefit of this disclosure, other compounds like amorphous silicon and silicon oxide may also be used as resistive layers. The depth (e.g., 0.25 μm) and resistivity of this layer may be adjusted to the design parameters desired for the device. The thickness of the resistive layer 205 can influence the multiplication coefficient, damping quality and linearity of response.

An n+ conductive layer 207 may be implanted on the bottom layer of the substrate 200. This layer serves as a conductive layer through which charge carriers can be routed. As will be apparent to one of ordinary skill, the conductive layer 207 may also be a p+ conductive layer.

On top of the resistive layer 205, an isolating material 210 (such as, for example, silicon dioxide) is deposited. The isolating material 210 may be used to decrease the heterojunction noise that may exist at the boundary between the resistive layer 205 and the epitaxial layer 215 described below. The isolating material 210 also serves to decrease the hole component of the dark current.

An epitaxial layer 215 of a crystalline p-type low impedance semiconductor material (e.g., silicon) is grown on top of the isolating material 210. The epitaxial layer is particularly beneficial in serving as a mechanism that carries out the avalanche process when depleted by working bias. The thickness of the epitaxial layer 215 may be selected to match the absorption length (i.e., the distance in which radiation travels before it is absorbed) of the light to be detected. This would essentially ensure that all light that enters this layer will be absorbed.

An $n^+$ semi-cylindrical, semiconductor electrode 220 is buried in the epitaxial layer 215. Two or more semi-cylindrical electrodes could be made to enhance electrical field. In one embodiment, a single layer of epitaxial p-type semiconductor may be deposited in any desired manner followed by the burying of the $n^+$ regions at the inner surface of that layer by, for example, high energy ion-beam implantation. In another embodiment, the epitaxial layer 215 may be deposited in successive stages with the $n^+$ regions implanted during the first deposition stage. The radius of the semi-cylindrical electrodes may be decreased to reach the electrical field strength necessary to satisfy avalanche conditions while the length of an individual electrode could be limited (e.g., 50 mm) to maintain proper quenching.

A thin conductive layer of $p^+$ semiconductor material 223 is built (e.g., by ion implantation) on the epitaxial layer 215. Although the electrical field in this layer is negligible, light absorbed in this layer could be detected due to the diffusion of charge carriers to the depleted region explained below. To minimize absorption, which results in loss of light, this layer could be made very thin. As will be apparent to those of ordinary skill in the art having the benefit of this disclosure, aluminum, titanium, and nickel may also be used as a conductive layer.

In an alternative embodiment, the layer could be composed of an $n^+$ semiconductor material.

An antireflective coating 225 may be deposited on top of the p+ conductive layer 223. Such an antireflective coating 225, can be designed to be approximately a quarter wavelength of the incident light to minimize light reflection from the semiconductor surface. As will be apparent to those of ordinary skill in the art having the benefit of this disclosure, silicon dioxide or similar films can be used as an antireflective coating.

Electrical contacts 235 and 240 are connected to the $p^+$ conducting layer 220 and the $n^+$ conductive layer 207. These electrodes collect the electrical signal generated in the crystalline epitaxial layer 215 when the detector is illuminated with light. As will be apparent to one of ordinary skill, the two electrical contacts have opposite polarity.

When a voltage is applied between the $p^+$ contact 235 and the $n^+$ contact 240, the resulting electric field fully depletes, or empties, the epitaxial layer 215 of all charge carriers forming a depletion region. As previously explained, light, or electromagnetic radiation, that encounters a detector, in accordance with the invention, can free charge carriers. Due to the presence of the depletion region, active transport of charge carriers resulting from the incident light occurs without charge recombination. Thus, electrons and holes are accelerated in the electric field, giving rise to avalanche multiplication.

It is beneficial for stable operation of a device employing an avalanche mechanism in accordance with the invention that the resistive layer limits the amplitude of high avalanche stochastic fluctuation. Therefore, high gain of the device could be reached in a very narrow avalanche region with low bias voltage and low noise factor.

5.2 Method of Invention

As will be apparent to those of ordinary skill in the art having the benefit of this disclosure, a multi-step method would be beneficial in providing a mechanism for using a detector in accordance with the invention to detect and quantify radiation. One such embodiment could use an external source of directed ionizing radiation (e.g., an x-ray source) to illuminate an object (region of interest). A detection device in accordance with the invention can be used to generate and amplify a signal after detecting the light quanta from materials that emit electromagnetic radiation when exposed to ionizing radiation. Signals, detected by the device, can be processed to generate an image of a portion of the region of interest or to compute an estimate of a physical characteristic (e.g., tumor size) or a physiological characteristic (e.g., blood flow).

As would be apparent to those of ordinary skill in the art having the benefit of this disclosure, numerous embodiments could result from using other types of external sources (e.g., gamma-ray, electron beam, proton beam, or neutron beam). An additional embodiment could result from infusing, instead of illuminating, a region of interest with a radioactive material. As will be apparent to those of ordinary skill, the radioactive material used to obtain an image could be an injectable radiopharmaceutical or a radioactive gas (e.g., metastable xenon) administered by inhalation.

5.3 Remarks

An apparatus and method in accordance with the invention can be used in very small, thin devices. These devices have the potential to yield higher amplification and lower intrinsic noise than conventional avalanche photodiodes because of a very thin sensitive layer and a limitation of high random fluctuations of generated pulses. These devices can also operate at room temperature, and be self-limiting with stable operation while operating at lower voltages (e.g., 50V) than conventional avalanche photodiodes. In addition, the present invention is not restricted to the red portion of the visible spectrum, is transparent to blue light while remaining self limiting, and allows for the enhancement of the avalanche multiplication by the reduction of the passive area on the diode.

Devices in accordance with the invention may be used in medical imaging, opto-electronics or any other application where light is to be detected, especially low levels of light. These devices can also be used for charged particle registration (i.e., counting of charge carriers) and localization in nuclear experiments and in medicine. Such a device has the potential to replace photomultiplier tubes in industry, science, and medicine.

It will be appreciated by those of ordinary skill in the art having the benefit of this disclosure that numerous variations from the foregoing illustration will be possible without departing from the inventive concept described therein. Accordingly, it is the claims set forth below, and not merely the foregoing illustration, which are intended to define the exclusive rights claimed in this application program.

What is claimed is:

1. A method of detecting light comprising illuminating an object with an external source of ionizing radiation from the object so as to emit electromagnetic radiation with a detector, detecting the electromagnetic radiation, and processing the detected signal, said detector comprising:
    a) a solid-state substrate comprising a low-impedance material;
    b) a resistive layer deposited on top of the substrate;
    c) an n-p diode formed on said resistive layer, wherein said n-p diode is formed by n+ electrodes buried in a p-type epitaxial layer; and
    d) a first electrical contact in communication with the solid-state substrate, and a second electrical contact in communication with the diode wherein said first and second electrical contacts operate to collect an electrical signal.

2. The method of claim 1, wherein the external source is an x-ray source.

3. The method of claim 1, wherein the external source is a gamma-ray source.

4. The method of claim 1, wherein the external source is an electron beam.

5. The method of claim 1, wherein the external source is a proton beam.

6. The method of claim 1, wherein the external source is a neutron beam.

7. A method of detecting light comprising infusing an object with a radioactive material so as to generate light, detecting the light with a detector, and processing the detected signal, said detector comprising:
    a) a solid-state substrate comprising a low-impedance material;
    b) a resistive layer deposited on top of the substrate;
    c) an n-p diode formed on said resistive layer, wherein said n-p diode is formed by n+ electrodes buried in a p-type epitaxial layer; and
    d) a first electrical contact in communication with the solid-state substrate, and a second electrical contact in communication with the diode wherein said first and second electrical contacts operate to collect an electrical signal.

8. The method of claim 7, wherein the radioactive material is a radiopharmaceutical.

9. The method of claim 7, wherein the radioactive material is a radioactive gas.

10. The method of claim 9, wherein the radioactive gas is metastable xenon.

* * * * *